(12) United States Patent
Heimlicher et al.

(10) Patent No.: US 7,432,703 B2
(45) Date of Patent: Oct. 7, 2008

(54) ROPE POSITION SENSOR

(75) Inventors: Peter Heimlicher, Fribourg (CH); Charles Rheme, Posieux (CH)

(73) Assignee: Optosys SA (CH)

( * ) Notice: Subject to any disclaimer, the term of this patent is extended or adjusted under 35 U.S.C. 154(b) by 114 days.

(21) Appl. No.: 10/983,049

(22) Filed: Nov. 5, 2004

(65) Prior Publication Data

US 2005/0099176 A1 May 12, 2005

(30) Foreign Application Priority Data

Nov. 6, 2003 (CH) ..................................... 1913/03

(51) Int. Cl.
*G01B 7/14* (2006.01)
(52) U.S. Cl. .............................. 324/207.16; 324/207.26
(58) Field of Classification Search ................... 324/67, 324/207.11, 207.26, 207.15, 207.16, 207.17
See application file for complete search history.

(56) References Cited

U.S. PATENT DOCUMENTS

| | | | | |
|---|---|---|---|---|
| 5,548,212 A | * | 8/1996 | Logue | ......................... 324/229 |
| 5,581,180 A | * | 12/1996 | Ito et al. | ................. 324/207.11 |
| 5,977,662 A | | 11/1999 | Hermann et al. | |
| 6,031,430 A | * | 2/2000 | Heimlicher | ................... 331/65 |
| 6,356,202 B1 | * | 3/2002 | Albrich et al. | ........... 340/686.2 |

* cited by examiner

*Primary Examiner*—Patrick Assouad
*Assistant Examiner*—David M. Schindler
(74) *Attorney, Agent, or Firm*—Ostrolenk, Faber, Gerb & Soffen, LLP

(57) ABSTRACT

A rope position sensor for the surveillance of the position of the traction or carrying rope of a transport installation on a grooved pulley comprises an inductive distance measuring unit capable of emitting an alternating magnetic field and of detecting the attenuation of that magnetic field by the presence of the rope 1 in a proximity zone. The sensor is adapted to detect the rope in at least three proximity zones ($z1$, $z2$, $z3$) and to produce an output signal containing information indicating the proximity zone in which the rope is being detected to indicate the position of the rope at the pulley.

22 Claims, 4 Drawing Sheets

ROPE POSITION SENSOR

BACKGROUND OF THE INVENTION

The present invention relates to use as a rope position sensor for sensing the position of a rope in a groove in a pulley and to a pulley assembly equipped with at least one such sensor.

There are many types of transport installations using wire ropes to ensure the traction of a vehicle, e.g. ski-lifts or chair lifts, funiculars, or cableways of any kind. Such ropes are running on pulleys serving for their guidance. Cableways generally comprise one or several carrying ropes. In this case, pulleys fastened to the vehicle serve as wheels on which the vehicle runs along the carrying rope.

Pulleys for wire ropes are provided with a circular groove which receives the rope and thereby defines the normal position of the rope with respect to the pulley in the radial and lateral directions. For the safety of the transport installations it is important that the rope always keeps this normal position on the pulleys. If a rope is misaligned with respect to the groove and runs to the left or to the right of the groove, this indicates a malfunction of the installation that may lead to the derailment of the rope in the worst case, i.e. to a situation where the rope is no longer on the pulley at all. For safety reasons, it is very important to detect such irregular situations. They generally require an immediate stop of the installation. Another anomaly that must be detected is a locked pulley, in which case the rope will wear away the pulley and gradually approach the rotation axis of the pulley.

A sensor for monitoring the position of the rope relative to the pulley is described in International Patent Application WO-99/27649. This sensor comprises several zones of influence in which it is capable of detecting the presence of the rope by means of proximity detectors. A sensor having three zones of influence has three signal outputs, and the signal at each one of the outputs indicates for a particular zone of influence, whether the rope is being detected in that zone or not. It is possible that a rope is being detected in two zones of influence simultaneously. This sensor comprises a distinct proximity detector for the surveillance of each zone. It is expensive, and its lifetime is limited as the risk of electronic malfunction of a proximity detector is multiplied by the number of detectors used in the sensor. Moreover, the verification of the correct operation of such a sensor is laborious since a plurality of proximity detectors have to be tested.

SUMMARY OF THE INVENTION

It is an object of the present invention to avoid these disadvantages and to provide a rope position sensor allowing the surveillance of the radial and lateral positions of a rope relative to a pulley having a groove with a high degree of safety and with reduced costs. This is accomplished with the sensor of the invention.

The invention provides a rope position sensor for the surveillance of the position of the traction or carrying rope of a transport installation. In the one application, the sensor is on a grooved pulley. The sensor comprises an inductive distance measuring unit capable of emitting an alternating magnetic field and of detecting the attenuation of that magnetic field by the presence of the rope in a proximity zone. The sensor is adapted to detect the rope in at least three proximity zones ($z1$, $z2$, $z3$) and to produce an output signal containing information indicating the proximity zone in which the rope is being detected to indicate the position of the rope at the pulley. The invention concerns the sensor and a pulley assembly including such a sensor.

The invention will be described in detail hereinafter with reference to drawings illustrating exemplary embodiments thereof.

DESCRIPTION OF A PREFERRED EMBODIMENT

Figure 1:
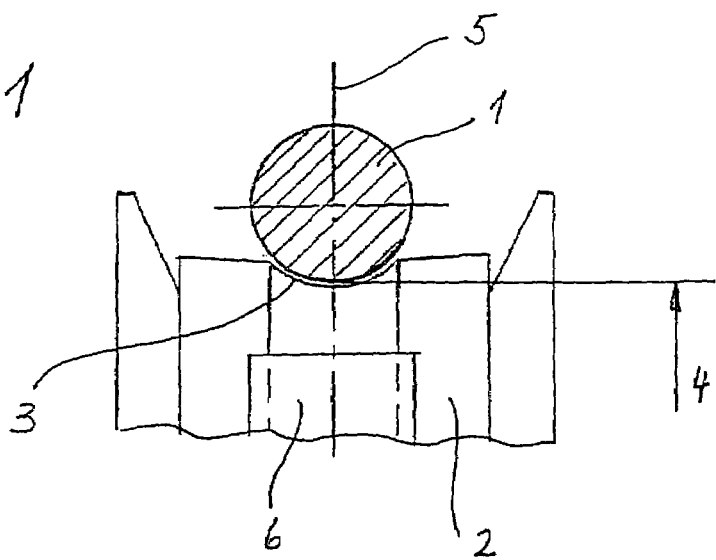
FIG. 1 shows the cross-section of a rope (according to sectional plane A-A in FIG. 8) running on a pulley provided with a rope position sensor.

FIG. 1 shows a typical situation for monitoring by a rope position sensor. A traction or carrying rope 1 of a transport installation is running on a pulley 2. More specifically, the rope is located in a groove 3 of the pulley. The groove determines the normal position of the rope with respect to the pulley in the radial and lateral directions by its radius 4 and its plane of symmetry 5, respectively.

Groove 3 of the pulley may be more or less pronounced and may have different shapes. It might even have a cylindrical center section, thereby allowing the rope a certain liberty of lateral movement inside the groove, but still the diameter of the pulley is greater left and right of the groove 3 than in the plane of symmetry 5 of the groove. This means that a misalignment of the rope relative to groove 3 of the pulley also implies a radial displacement of rope 1 toward the exterior. Thus, the two states of emergency that must be detected, i.e. a misalignment of the rope and the case of a blocked pulley, become apparent through radial displacements of rope 1 in opposite directions, thereby allowing to detect these situations by monitoring the position of rope 1 merely in this radial direction.

The surveillance of the radial position of the rope relative to the pulley is realized by means of an inductive measuring unit whose operation is basically the same as that of the measuring unit of an ordinary inductive proximity sensor: It emits an alternating magnetic field and detects the attenuation of the magnetic field that is the result of the presence of a metal object in its perimeter, in this case of the traction or carrying rope 1.

Since it is the radial position of the rope relative to the axis of the pulley that is to be monitored, the sensor is preferably arranged in the plane of symmetry of the groove of the pulley so that its magnetic field is directed toward the rope. It is thus possible by means of a single inductive measuring unit to detect situations where the rope is too close to the sensor or too distant therefrom as compared to its position during normal operation of the transport installation.

When the sensor is arranged in the plane of symmetry of the groove of the pulley, any lateral displacement (i.e. parallel to the axis of the pulley) of the rope implies an increase of the distance between the rope and the sensor. This is the case in the event of a misalignment of the rope, which simultaneously implies a radial displacement of the rope toward the exterior, as explained above. To ensure that this displacement toward the exterior also results in an increase of the distance between the rope and the sensor, the sensor is preferably arranged upstream or downstream of the pulley and on the same side of the rope as the pulley. The contours of a rope position sensor 6 arranged in this position are shown in FIG. 1.

Figure 2:
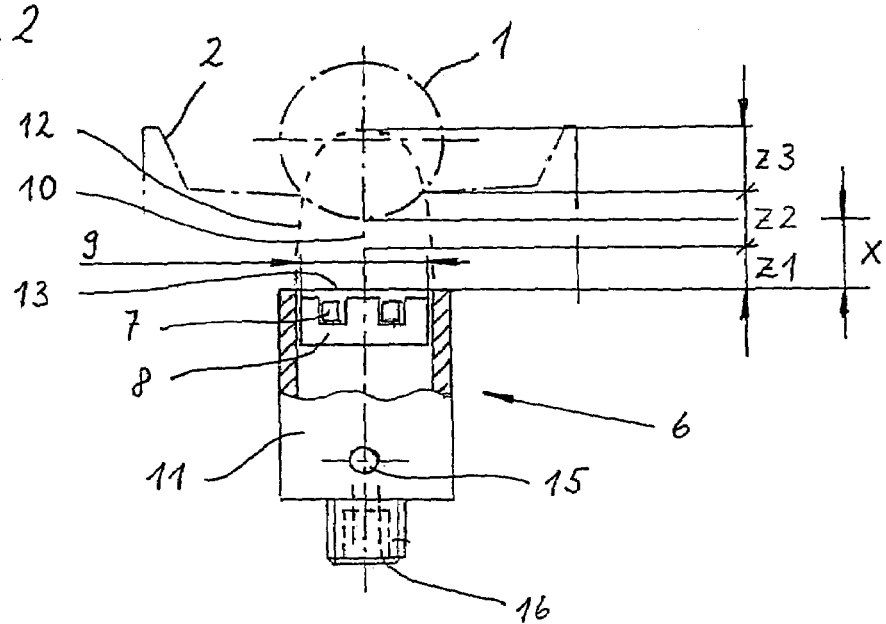
FIG. 2 shows the contours of the rope and the pulley of FIG. 1 as well as the rope position sensor of FIG. 1 in a partial longitudinal section.

FIG. 2 shows the contours of the rope and of the pulley of FIG. 1, as well as the rope position sensor in a partially sectioned view. The measuring unit comprises an oscillator including an oscillating circuit with a coil 7 having an open core 8 for emitting the magnetic field in a main direction. Here, a pot core is used, but an E-core would also be possible for example. The sensor is sensitive in this direction essentially and its measuring axis 10 in the center of the magnetic field indicates this main direction. The sensor is preferably arranged such that its measuring axis 10 is located in the plane of symmetry 5 of groove 3 so that a misalignment of the rope is always detected whether to the left or to the right of the groove. The direction of a misalignment has no influence on the detection signal if measuring axis 10 is an axis of symmetry of magnetic field 12. This is the case in the present example: Coil 7 and pot core 8 are cylindrical in shape, such that their common axis is an axis of symmetry of magnetic field 12.

The sensor 6 has an enclosure 11 and the coil 7 of the measuring unit is arranged inside this enclosure 11 and emits the magnetic field 12 through one of its walls. When the rope touches the outer surface of this wall, called the sensor surface 13, the distance between the rope and the sensor is zero. Unless otherwise specified, measuring distances or lengths of proximity zones will be indicated along measuring axis 10 for a rope 1 that is represented by a cylindrical metal bar having a diameter of 30 mm (the diameter of a medium-sized rope) whose center line 14 (see FIG. 7) intersects measuring axis 10 at an angle of 90 degrees. The maximum distance for which the measuring unit is able to detect the presence of a rope is the range of the measuring unit.

The detection of the different situations of rope 1 relative to pulley 2 requires a sensor 6 having a magnetic field 12 of a sufficient range. First of all, the range can be increased by increasing the width of the magnetic field. If a coil 7 having a pot core 8 is used, the range of magnetic field 12 can be extended by increasing the external diameter 9 of the core. However, a wide magnetic field 12 has the disadvantage that sensor 6 will become less sensitive to a lateral displacement of rope 1 relative to measuring axis 10, which is mainly detected when rope 1 moves out of magnetic field 12 laterally. Preferentially, a coil 7 is used whose core 8 has a width 9 that corresponds to the diameter of the rope 1 that is being monitored, i.e. generally between 20 and 40 mm, such that the magnetic field has approximately the same width. In order to still achieve a sufficient range of the sensor, the measuring unit is preferably arranged such that its magnetic field 12 is sufficient for detecting the presence of the rope 1 at a distance from the core 8 of coil 7 that corresponds to at least six tenths of the external diameter of core 8.

Such a large range of the measuring field relative to its width implies the necessity of detecting small variations of the magnetic field, which is difficult mainly because of variations of parameters of the oscillating circuit, especially of the ohmic resistance of coil 7 of that circuit, as a function of temperature. A specific oscillating circuit that allows compensation for the temperature dependence and thus to increase the range of the measuring field of an inductive measuring unit is described in European Patent EP-70796 of the applicant. A maximum measuring range is achieved if the oscillating circuit is complemented by a thermal stabilizing circuit as described in European Patent EP-813306 of the applicant. Such a stabilizing circuit comprises a circuit for determining the temperature by measurement of the ohmic resistance of coil 7 and a compensating circuit to compensate for thermal variations of parameters of the oscillating circuit, especially variations of resistance of the oscillating circuit as a function of the temperature.

The sensor is adapted to detect rope 1 in at least three distinct proximity zones $z1$, $z2$, $z3$ within its magnetic field 12 which are located at different distances from the sensor, and to produce a sensor output signal containing information as to the proximity zone $z2$ in which rope 1 is being detected. Proximity zones $z1$, $z2$, $z3$ are preferably consecutive, i.e. there are neither gaps nor overlaps between the distinct proximity zones. This is the case in the present example: an intermediate zone $z2$, within which the position of the rope may vary during normal operation of the transport installation, is preceded by a proximity zone $z1$ and followed by a proximity zone $z3$. The latter are zones of exception that allow the detection of different kinds of malfunctions.

A plurality of zones of exception $z1$, $z3$ might be provided before and/or beyond intermediate zone $z2$ in order to enable a more precise detection of the kind and/or the extent of a malfunction. Thus, for example, two zones of exception may be distinguished beyond the intermediate zone to allow a distinction between a misaligned rope and a derailed (and therefore completely absent) one.

Since rope 1 is not a perfect metal bar but a combination of wires having a rippled surface, intermediate zone $z2$ preferably has a length of 8 mm at least. To permanently ensure a safe distance between the surface of sensor 13 and rope 1 even in the case where the rope approaches the sensor due to a blocked pulley 2, the intermediate zone preferably starts at a distance of at least 6 mm from the sensor surface. To ensure a safe detection of a derailment of rope 1, the length of zone of exception $z3$ on the far side of the intermediate zone (or the sum of their lengths if several zones are provided) is also at least 6 mm. Thus, the magnetic field preferably has a range of at least 20 mm (6 mm+8 mm+6 mm).

The detection of a rope in intermediate zone $z2$ is indicated by a blinking LED 15. This mainly facilitates the work of the assembler who, after having aligned the rope with the groove of the pulley (or vice-versa), will have to position the sensor with respect to the pulley such that the rope is located within this intermediate zone.

Enclosure 11 of the sensor is a metal sleeve. On the side of coil 7, the sleeve is sealed by a non-magnetic material, generally a synthetic resin, which is not shown in the drawing. On the other side, enclosure 11 comprises an electric connector for the connection of power supply 16 and of a signaling line.

Figure 3:
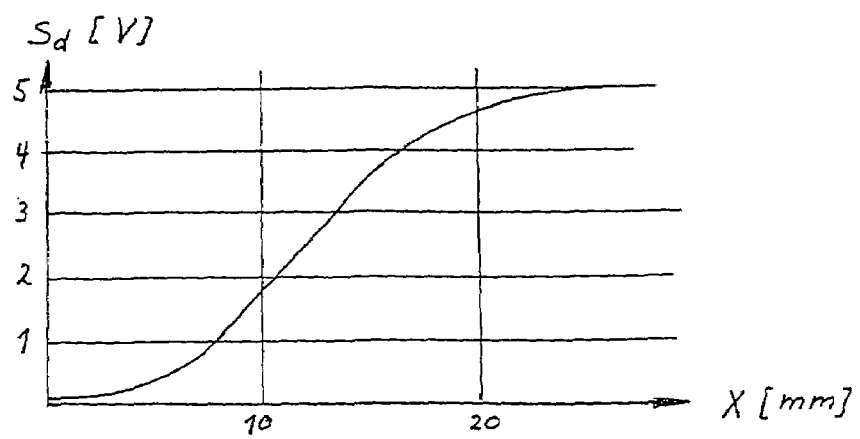
FIG. 3 shows the detection signal produced by the measuring unit of the sensor of FIG. 2 as a function of the distance between the rope and the sensor.

As already mentioned, coil 7 is part of an inductive measuring unit. More specifically, it is part of an oscillating circuit of the measuring unit that generates an alternating magnetic field emanating from coil 7. An eddy current is thus induced in the measured object (the rope), thereby attenuating the magnetic field, and the resulting attenuation is detected by the measuring unit and is used for generating a detection signal $s_d$. FIG. 3 shows the graph of such a signal $s_d$ as a function of the distance x between the rope and the sensor. The level thereof continuously increases as the distance increases, and in that respect, it can be said that the detection signal is essentially proportional to the distance between the sensor and the rope.

Figure 4:
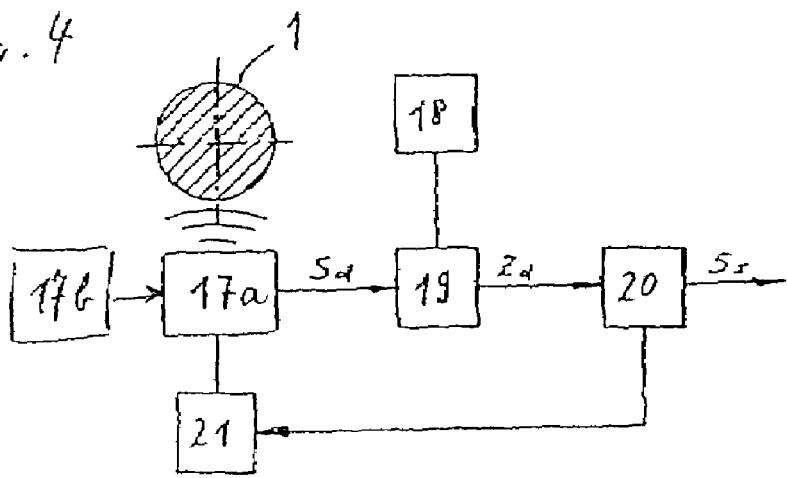
FIG. 4 is a block diagram of the rope position sensor of FIG. 2.

FIG. 4 shows the block diagram of the rope position sensor. The latter includes a reference means 18 that determines reference values of detection signal $s_d$, thereby defining the proximity zones. In order to define n consecutive proximity zones, n−1 reference values are required. A comparator unit 19 compares the detection signal $s_d$ to the reference values, and a signaling unit 20 generates an output signal $s_s$ that contains information indicating the zone in which the rope is being detected. Output signal $s_s$ is preferably encoded so as to allow its transmission on a single signaling line.

For safety reasons it is important to monitor not only the position of the rope but also the proper operation of the sensor that is being used for the surveillance. The sensor includes a monitoring unit 21 for injecting periodic monitoring pulses into a circuit of the sensor, e.g. electrical voltage pulses, which appear in output signal $s_s$ if the circuit between the injection point and the output is operative. The monitoring pulses are preferably injected at the level of the oscillator of inductive measuring unit 17a, so that the output signal contains information indicating the proper operation of the entire measuring, comparison, and signaling chain. A thermal stabilizing circuit 17b optionally complements the oscillator of inductive measuring unit 17a, and compensates for thermal variations of parameters of the oscillator.

The monitoring unit 21 has at least two operating modes differing in their effect upon the output signal, thereby allowing determination of the operating mode of the monitoring unit by observing output signal $s_s$. The signaling unit 20 controls the operating mode of the monitoring unit 21 (hereinafter called "monitoring mode") as a function of the zone zd in which the rope has been detected. The monitoring mode is used for encoding the output signal. This approach offers the advantage that a single periodic component of the output signal (the effect of the monitoring pulses) contains both the safety information and part or all of the information regarding the position of the rope, thereby limiting the complexity of the output signal and facilitating its processing, transmission, and interpretation.

For sensors having three or four proximity zones, the operating modes of the preferred monitoring unit are "activated" and "deactivated", which are characterized by the presence and the absence of periodic monitoring pulses, respectively. In this case, the "activated" operating mode will be selected when the rope is being detected in an operative zone, i.e. a proximity zone where it may be located during normal operation of the installation. As a matter of fact, the proper operation of the sensor should be monitored especially during normal operation of the installation.

The signaling unit 20 preferably generates a digital output signal having either one of the basic states 0 or 1 and in which the monitoring pulses appear as digital pulses. Thus, the simplest output signal results when the signaling unit 20 controls its basic state as well as the monitoring mode for encoding the information indicating the zone in which the rope is being detected. If the monitoring unit 21 includes the two operating modes "activated" and "deactivated", the combinations with the basic states 0 and 1 of the output signal allow to distinguish four proximity zones.

In principle it would be possible to process the detection signal $s_d$ digitally, with a memory for storing the reference values and a microcomputer for comparing the detection signal $s_d$ to these reference values and for generating a digital output signal. This approach would offer the advantage that the sensor would be programmable, thereby allowing an easy adjustment of the size of the detection zones or of other parameters. However, a microcomputer, or more generally any circuit using sequential logic, may be subject to an unexpected operating condition in which it is blocked. To ensure maximum reliability of the sensor, a circuit containing only analog components and combinatorial logic elements is preferred. In this context, the control of the monitoring mode as a function of the zone in which the rope is being detected proves to be useful.

Figure 5:
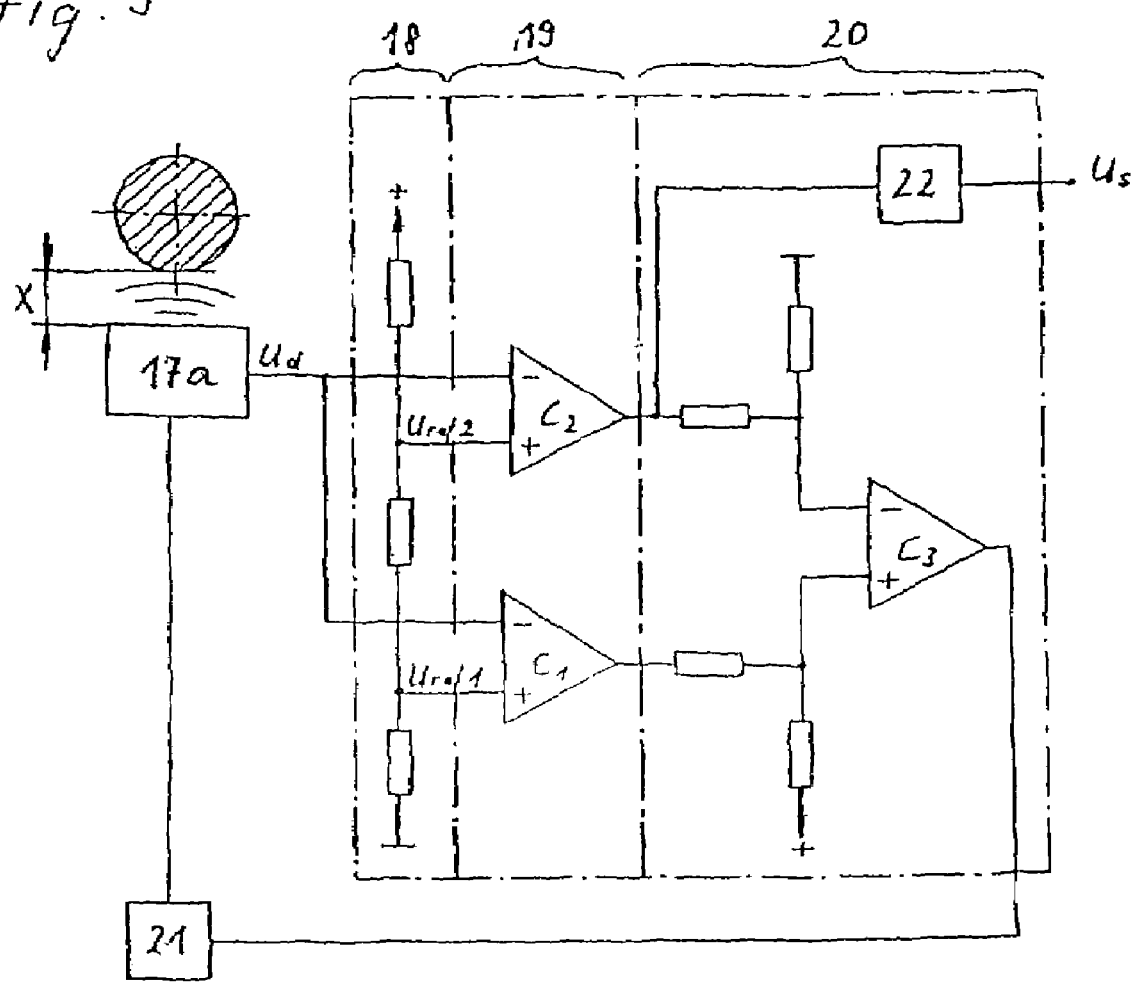
FIG. 5 is a simplified wiring diagram of the sensor of FIG. 2 for the detection of three proximity zones, and corresponds to the block diagram of FIG 4, except that thermal stabilizing circuit 17$b$, shown in FIG. 4, is not shown.

The simplified circuit diagram of such a sensor having three proximity zones is represented in FIG. 5: The inductive measuring unit 17a is analog and the detection signal $s_d$ generated by the latter is a voltage $u_d$. The reference means 18 is a voltage divider that determines the reference voltages $u_{ref1}$ and $u_{ref2}$. Comparator unit 19 comprises two voltage comparators c1, c2 for comparing $U_d$ to the reference voltages $u_{ref1}$ and $U_{ref2}$, respectively. Signaling unit 20 uses the output signal of comparator c2, amplified by an output circuit 22, for output signal $s_s$ of the sensor, which is a voltage $u_s$. It may be said that the output signal is deduced from the output of comparator c2 by a combinatorial logic circuit: even a simple electric conductor connecting the output of c2 directly to the terminal of connector 16 (see FIG. 2) intended for the output signal would represent a combinatorial logical element.

The monitoring unit 21 is deactivated when the rope is being detected in zones z1 ($u_d<u_{ref1}$) or z3 ($u_d>u_{ref2}$) and activated only in the event that the rope is being detected in intermediate zone z2, i.e. when $u_{ref1}<u_d<u_{ref2}$. To this end, comparator c3 of signaling unit 20 generates a digital signal which is 1 when the rope is being detected in zones z1 or z3 and which changes to 0 when it is being detected in proximity zone z2. Since the signals at the outputs of comparators c1 and c2 are already digital, the circuit comprising comparator c3, which deduces another digital signal therefrom, is a combinatorial logic circuit.

Figure 6:
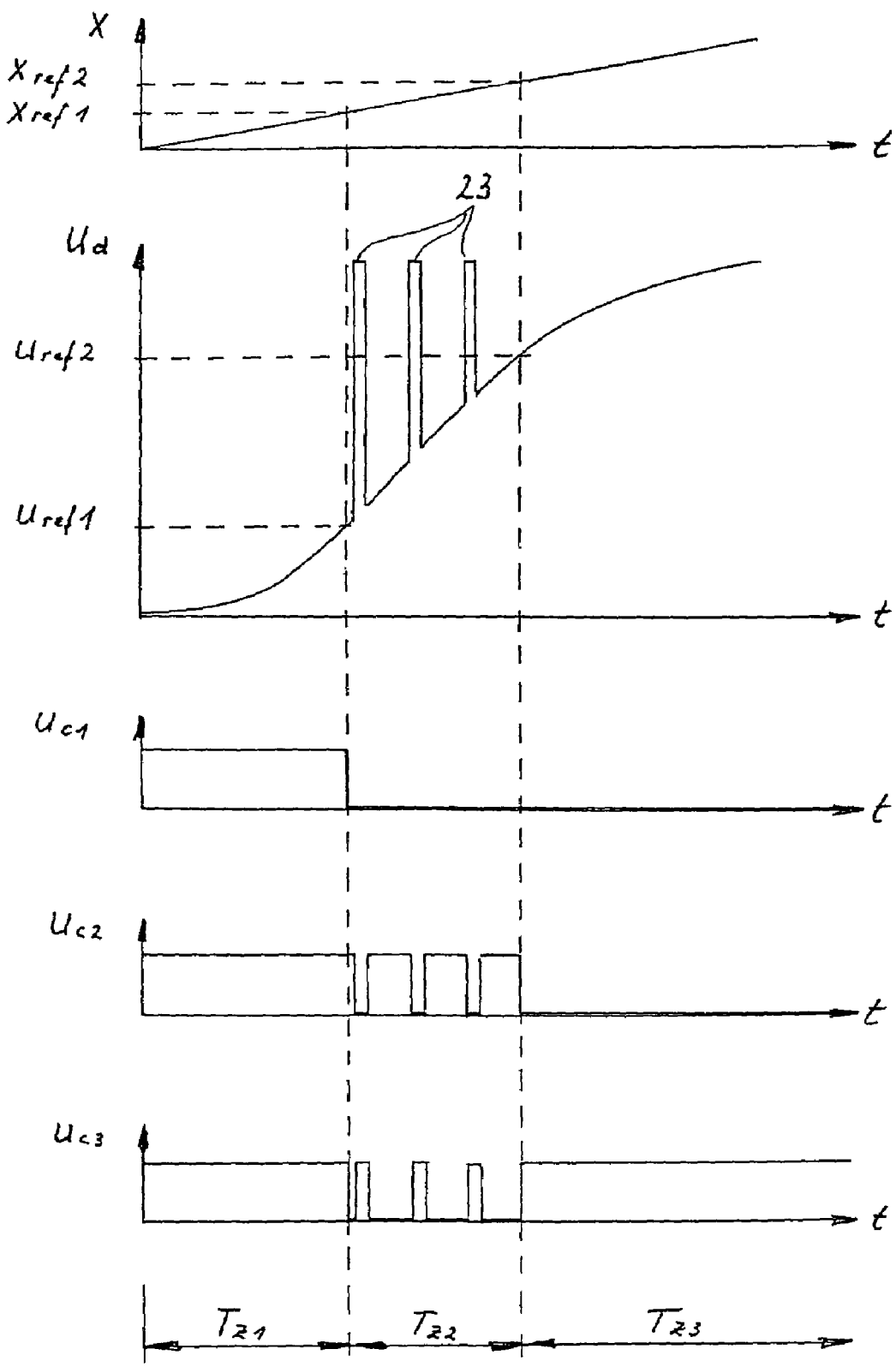
FIG. 6 depicts signals vs. time in a circuit according to the diagram of FIG. 5 when the rope is moved away from the pulley at a constant rate.

FIG. 6 shows different signals vs. time in a circuit according to the diagram of FIG. 5 when the rope is moved away from the pulley at a constant rate. An exception is the first graph, which does not represent an electric signal but the increase of the distance x between the rope 1 and the sensor surface 13. The second graph shows the detection voltage $u_d$, which increases continuously as explained above with reference to FIG. 3.

The reference means determines the reference voltages $u_{ref1}$ and $u_{ref2}$, thereby defining reference distances $x_{ref1}$ and $x_{ref2}$ which divide the measuring field of the sensor into three consecutive proximity zones. Since the rope moves away continuously, three periods of time Tz1, Tz2, and Tz3 can be distinguished during which the rope is located in zones z1, z2, and z3, respectively. During period Tz2, the monitoring unit is activated and is injecting monitoring pulses at the level of the oscillating circuit of the measuring unit, thus producing periodic voltage pulses 23 in detection voltage $u_d$.

The three following graphs show the voltages $u_{c1}$, $u_{c2}$ and $u_{c3}$ at the outputs of comparators c1, c2, and c3. At the output of comparator c2, the monitoring pulses appear as digital pulses. This signal $u_{c2}$ is the output signal of the sensor: the basic level of this signal (1 or 0) and the presence or the absence of the monitoring pulses allows determination of the zone in which the rope is being detected. The output of comparator c3 is 0 only if the rope is being detected in zone z2. This signal controls the operating mode of the monitoring unit. In addition, it also contains the repercussion of the monitoring pulses, but this is not a problem: since the monitoring unit produces these pulses, it may easily be designed to ignore their echo in the signal controlling its own monitoring mode.

Figure 7:
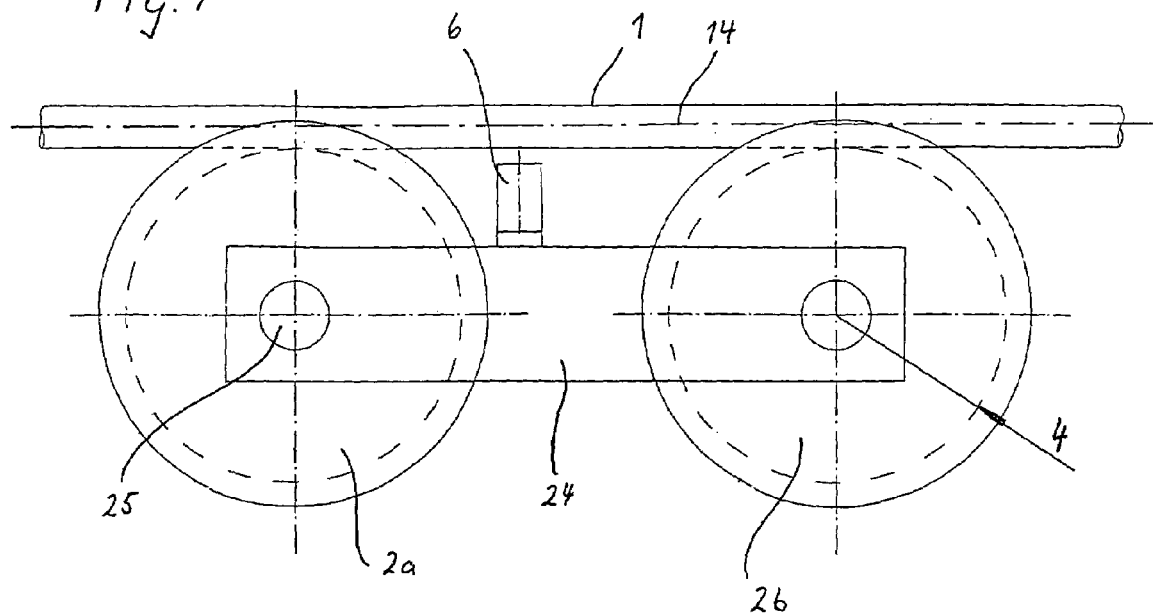
FIG. 7 shows a pulley assembly with two pulleys and a rope running on the pulleys.
Figure 8:
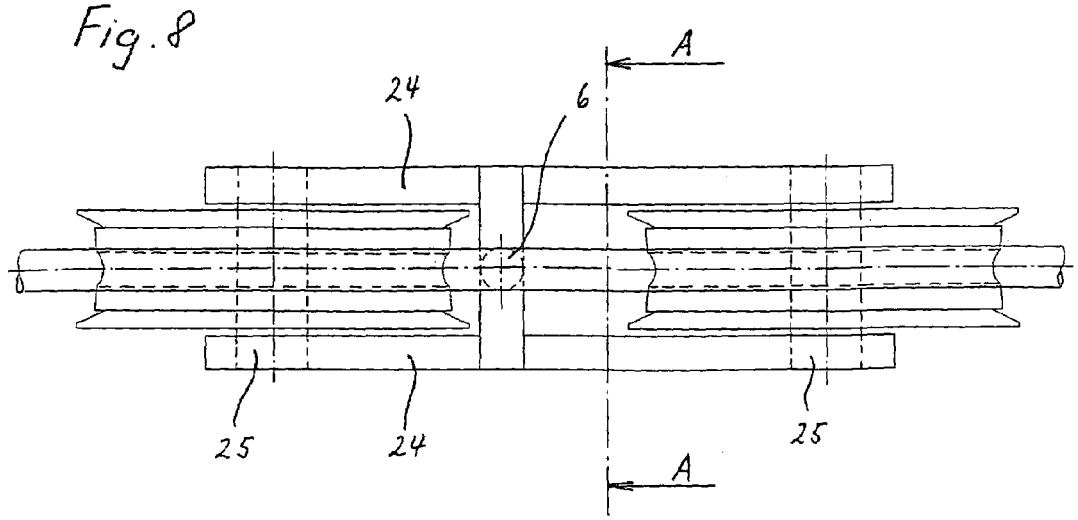
FIG. 8 is a top view of the pulley assembly of FIG. 1.

FIGS. 7 and 8 show the simplified construction of a pulley assembly in a transport installation, comprising two pulleys 2a, 2b. The axes 25 of the pulleys are connected to each other by two lateral members 24 with which they form the supporting member of the assembly. Rope position sensor 6 is fastened to this supporting member near pulley 2a. It is understood that such an assembly may also comprise only one pulley or conversely a greater number of pulleys.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A position sensor for surveillance of a position of a traction or carrying rope of a transport installation on a grooved pulley, comprising:
    an enclosure;
    an inductive distance measuring unit arranged in the enclosure, the inductive distance measuring unit comprising an oscillating circuit including a coil having an open pot core for emitting an alternating magnetic field of the coil in a main direction in order to induce an eddy current in the rope, the inductive distance measuring unit being capable of detecting an attenuation of the magnetic field due to said eddy current;
    a reference device operable to define at least three distinct proximity zones within the magnetic field, which zones are situated at different distances from the sensor, the reference device determining reference values of a detection signal, the detection signal being generated based on the attenuation, each of the reference values defining a boundary of a proximity zone;
    a comparator for comparing the detection signal to the reference values to determine the proximity zone in which the rope is detected; and
    an output signaling unit for generating an output signal of the sensor containing information indicating the proximity zone in which the rope is detected.

2. A sensor according to claim 1, wherein the proximity zones in which the presence of the rope is detectable are consecutive.

3. A sensor according to claim 1, wherein the proximity zones comprise an intermediate zone extending over a length of at least 8 mm, at least one proximity zone on the nearer side of the intermediate zone and one proximity zone on the farther side of the intermediate zone.

4. A sensor according to claim 1, wherein the coil is arranged such that the coil has a range of its magnetic field in the main direction sufficient for detecting the presence of the rope at a distance from the core that corresponds to at least six tenths of an external diameter of the core.

5. A sensor according to claim 1, further comprising a thermal stabilizing circuit complementing the oscillating circuit, the thermal stabilizing circuit comprising a circuit for determining a temperature by a measurement of ohmic resistance of the coil and a compensating circuit for compensating for thermal variations of parameters of the oscillating circuit.

6. A sensor according to claim 5, wherein the thermal variations of parameters of the oscillating circuit include variations of the ohmic resistance of the coil as a function of the temperature.

7. A sensor according to claim 5, wherein the compensating circuit compensates for variations of the ohmic resistance of the coil as one of the parameters of the oscillating circuit.

8. A sensor according to claim 1, wherein the core has a width of 20 to 40 mm, so that the magnetic field has approximately the same width.

9. A sensor according to claim 1, wherein the magnetic field of the coil has an axis of symmetry, and the coil is adapted to be mounted such that the axis of symmetry is situated in a plane of symmetry of the groove of the pulley.

10. A sensor according to claim 9, wherein the coil is adapted to be mounted such that the axis of symmetry is located on the same side of the rope as the pulley.

11. A sensor according to claim 1, wherein the output signal of the sensor is encoded to allow its transmission on a single signaling line.

12. A sensor according to claim 1, wherein:
    the inductive distance measuring unit is operable to produce the detection signal which is analog and which is essentially proportional to the distance between the rope and the sensor; and
    wherein:
    the reference device is operable to determine at least two of the reference values for defining at least three proximity zones;
    and
    the output signaling unit generates the output signal as a function of the result of the comparison performed by the comparator.

13. A sensor according to claim 12, further comprising a monitoring unit operable to inject periodic monitoring pulses into a circuit of the sensor which periodic monitoring pulses appear in the output signal and provide information with respect to the proper operation of the circuit between the injection point and the output;
    the monitoring unit operating in at least two operation modes with respective effects upon the output signal, and the signaling unit controlling selection of the operation mode as a function of the proximity zone in which the rope is detected.

14. A sensor according to claim 13, wherein the monitoring unit is operable to inject the periodic monitoring pulses into the oscillator such that the repercussion of the periodic monitoring pulses on the output signal provides information indicating the operation of the entire measuring, comparison, and signaling chain.

15. A sensor according to claim 14, wherein the monitoring unit operation modes comprise an activated and a deactivated operation mode which respectively have the presence and the absence of the periodic monitoring pulses.

16. A sensor according to claim 13, wherein the monitoring unit operation modes comprise an activated and a deactivated operation mode which respectively have the presence and the absence of the periodic monitoring pulses.

17. A sensor according to claim 13, wherein the output signal is a digital signal having either one of the basic states 0 or 1, the periodic monitoring pulses appear in this output signal as digital pulses, and the signaling unit is adapted to control both the basic state of the output signal and the operation mode as a function of the proximity zone in which the rope is detected.

18. A sensor according to claim 13, wherein the detection signal is a detection voltage, the periodic monitoring pulses appear in the detection signal as voltage pulses, and the reference values are determined as reference voltages;
    the comparator unit comprises a respective comparator for each of the reference values to compare each of the reference values to the detection voltage, each of the respective comparators having an output; and the signaling unit comprises a combinatorial logic circuit, connected to the output of at least one of the comparators, for generating the output signal.

19. A sensor according to claim 18, wherein the signaling unit comprises a combinatorial logic circuit, connected to the output of at least one of the comparators, for producing a signal that determines the operation mode.

20. A sensor according to claim 1, wherein the at least three proximity zones include four proximity zones at the most.

21. A sensor according to claim 1, wherein the at least three proximity zones are three proximity zones.

22. Pulley assembly for a transport installation having a carrying or traction rope, comprising a supporting member with at least one rotating grooved pulley thereon and at least one rope position sensor according to claim 1 fastened to the supporting member for the surveillance of the rope position on the at least one pulley.

* * * * *